(12) United States Patent
Jeong

(10) Patent No.: US 7,978,549 B2
(45) Date of Patent: Jul. 12, 2011

(54) FUSE CIRCUIT AND SEMICONDUCTOR MEMORY DEVICE INCLUDING THE SAME

(75) Inventor: You-Chul Jeong, Suwon-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 339 days.

(21) Appl. No.: 12/320,629

(22) Filed: Jan. 30, 2009

(65) Prior Publication Data
US 2009/0196113 A1    Aug. 6, 2009

(30) Foreign Application Priority Data
Feb. 1, 2008    (KR) .................. 10-2008-0010768

(51) Int. Cl.
*G11C 29/00*    (2006.01)
(52) U.S. Cl. .......... 365/200; 365/225.7; 365/189.07; 365/189.05
(58) Field of Classification Search .............. 365/200, 365/225.7, 189.07, 189.05
See application file for complete search history.

(56) References Cited

U.S. PATENT DOCUMENTS

| | | | |
|---|---|---|---|
| 6,735,108 B2 * | 5/2004 | Kurth et al. ............. | 365/149 |
| 7,193,908 B2 | 3/2007 | Kawasaki et al. | |
| 7,215,177 B2 | 5/2007 | Sueoka | |
| 7,317,651 B2 | 1/2008 | Kim et al. | |
| 2003/0133340 A1* | 7/2003 | Lee ........................... | 365/200 |
| 2004/0208050 A1* | 10/2004 | Kurth et al. ............. | 365/149 |
| 2007/0189053 A1* | 8/2007 | Pellizzer et al. ......... | 365/96 |

FOREIGN PATENT DOCUMENTS

| | | |
|---|---|---|
| JP | 2006-059429 A | 3/2006 |
| JP | 2006-197124 A | 7/2006 |
| KR | 10-0687042 B1 | 2/2007 |

* cited by examiner

*Primary Examiner* — Tuan T. Nguyen
(74) *Attorney, Agent, or Firm* — Lee & Morse, P.C.

(57) ABSTRACT

The fuse circuit includes a first program unit, a second program unit and a sensing circuit. The first and second program units are programmed simultaneously. The first program unit is programmed in a program mode in response to a fuse program signal and outputs a first signal in a sensing mode, such that the first signal increases when the first program unit is programmed. The second program unit is programmed in the program mode in response to the program signal and outputs a second signal in the sensing mode, such that the second signal decreases when the second program unit is programmed. The sensing circuit generates a sensing output signal in response to the first and second signals, such that the sensing output signal indicates whether or not the program units are programmed.

20 Claims, 6 Drawing Sheets

FUSE CIRCUIT AND SEMICONDUCTOR MEMORY DEVICE INCLUDING THE SAME

BACKGROUND

1. Field

Example embodiments relate to a fuse circuit. More particularly, embodiments relate to a fuse circuit having improved reliability and a semiconductor memory device including the fuse circuit.

2. Description of the Related Art

As the integration degree of a semiconductor memory increases, a capacity of the semiconductor memory is increasing rapidly. Increasing capacity includes increasing a number of memory cells in a chip. As the number of memory cells increases, a number of defective memory cells also increases. Since an existence of a single defective memory cell causes a critical problem in the semiconductor memory device, redundant memory cells are provided to compensate for the defective memory cells. Based on fuse information, redundant memory cells may replace defective memory cells. When an address of the defective memory cell is input, a normal path is cut off and a redundancy path to the redundant cell is activated according to programmed/unprogrammed state of the fuse.

A laser fuse, which is one of the widely used fuses, is programmed by cutting the fuse formed with a metal line using laser beam. The laser fuse has an advantage of being simply embodied, since an additional circuit to control cutting of the fuse is unnecessary. The laser fuse, however, has disadvantages, including limiting integration density regardless of the development of the semiconductor memory manufacturing process technology, e.g., metal oxide semiconductor (MOS) process, since a predetermined interval between the fuses has to be secured to prevent damages due to laser fusing. Furthermore, the laser fuse cannot be reprogrammed after the memory chip including the fuse circuit is packaged.

To overcome these disadvantages, an electrical fuse and an anti-fuse programmed using an electrical signal have been proposed. Such fuses have advantages that they can be reprogrammed even after the memory chip is packaged since they are activated or deactivated by the electrical signal. In addition, the size of the fuse circuit may be reduced as the scale of the manufacturing process is reduced.

A conventional fuse circuit includes a program unit including an electrical fuse, a reference voltage generator, and a comparator. The electrical fuse included in the program unit has a sufficiently smaller resistance than a resistance of the reference voltage generator before being programmed in a program mode, but has a larger resistance than the resistance of the reference voltage generator when the electrical fuse is cut by being programmed in the program mode, since the electrical fuse operates as an open circuit. The program unit and the reference voltage generator output respective voltages that are, in proportion to each resistance, pulled down from a power supply voltage. The comparator compares an output voltage of the program unit with an output voltage of the reference voltage generator and generates an output signal which indicates whether or not the electrical fuse is programmed, i.e., whether or not the electrical fuse is cut.

Another conventional fuse circuit includes a program unit including an anti-fuse, a reference voltage generator, and a comparator. The anti-fuse of the program unit has a sufficiently larger resistance than a resistance of the reference voltage generator before being programmed in a program mode, but has a smaller resistance than the resistance of the reference voltage generator when the program unit is programmed in the program mode, since the anti-fuse is electrically shorted. The program unit and the reference voltage generator output respective voltages that are, in proportion to each resistance, pulled down from a power supply voltage. The comparator compares an output voltage of the program unit with an output voltage of the reference voltage generator and generates an output signal which indicates whether or not the anti-fuse is programmed, i.e., whether or not the anti-fuse is electrically shorted.

The resistance of the program unit including the electrical fuse increases when the program unit is programmed and the output voltage of the program unit decreases. In contrast, the resistance of the program unit including the anti-fuse decreases when the program unit is programmed and the output voltage of the program unit increases. The output voltages of the program units change after being programmed. The comparators compare the reference voltage of the reference voltage generators with the output voltages of the program units, and determine whether or not the program units are programmed based on the comparison results.

As such, in the conventional fuse circuit, the reference voltage generators output a fixed reference voltage, and the comparators compare the fixed reference voltage with the output voltage of the program units including the electrical fuse or the anti-fuse and determine whether or not the program units are programmed. In the electrical fuse implementation, residues remain around the cutting area. Thus, the resistance of the program unit may not increase sufficiently. Such residues form an electrical path having a finite resistance. In the anti-fuse implementation, an electrical short may be incomplete. Thus, the resistance of the program unit may not decrease sufficiently. When the change of the resistance of the program units is insufficient, programming is incomplete and whether or not the program unit is programmed is indefinite, thereby degrading the reliability of the fuse circuit.

The electrical fuse is programmed (i.e. cut) by applying a relatively high current through the electrical fuse in response to a control signal. The electrical fuse can be cut by externally applying the control signal even after the fuse circuit is packaged. The electrical fuse, however, requires a large control driver for applying a high current through the electrical fuse. Thus, the size of the fuse circuit is relatively large.

The anti-fuse is programmed (i.e., electrically shorted) by applying a relatively high voltage to the anti-fuse in response to a control signal. Generally, the anti-fuse is a capacitor having both ends electrically connected when dielectric material in the capacitor is damaged by the applied high voltage. The anti-fuse can be programmed by externally applying the control signal even after the fuse circuit is packaged. The reliability of the anti-fuse is determined according to a level of the applied voltage. Thus, the anti-fuse needs high voltage for reliability.

As such, the electrical fuse and the anti-fuse have advantages, but also have a common disadvantage that their reliability is lower than the laser fuse, since electrical characteristic of such fuses may be varied according to the change of manufacturing process. To increase the reliability of the electrical fuse and the anti-fuse, various methods are proposed, but conventional methods can not guarantee the reliability of the fuses.

SUMMARY

Embodiments are therefore directed to a fuse circuit and a semiconductor device including the same, which substantially obviate one or more problems due to limitations and disadvantages of the related art.

It is a feature of an embodiment to provide a fuse circuit having an improved reliability and a semiconductor memory device including such a fuse circuit.

It is a feature of an embodiment to provide a fuse circuit comparing complementarily changing signals by a programming operation to determine whether or not program units are programmed and a semiconductor memory device including such a fuse circuit.

In some example embodiments, a fuse circuit may include a first program unit, a second program unit, and a sensing circuit.

The first program unit may be programmed in a program mode in response to a program signal and may output a first signal in a sensing mode, such that the first signal increases when the first program unit is programmed. The second program unit may be programmed in the program mode in response to the program signal and may output a second signal in the sensing mode, such that the second signal decreases when the second program unit is programmed. The sensing circuit may generate a sensing output signal in response to the first and second signals, where the sensing output signal indicates whether or not the program units are programmed.

In an example embodiment, a resistance of the first program unit may increase when the first program unit is programmed, and a resistance of the second program unit may decrease when the second program unit is programmed.

In an example embodiment, the first program unit may include an electrical fuse which is connected between a first voltage terminal and an output node of the first signal, and the second program unit may include a reference resistor and an anti-fuse which are connected in parallel between a second voltage terminal and an output node of the second signal.

In the sensing mode, a common voltage may be applied to the first and second voltage terminals.

In an example embodiment, the first program unit may include an electrical fuse connected between a first voltage terminal and an output node of the first signal, and a first program transistor connected between the output node of the first signal and a ground voltage, and a gate of the first program transistor receives the program signal.

The second program unit may include a reference resistor connected between a second voltage terminal and an output node of the second signal, an anti-fuse having a first end coupled to the second voltage terminal, a switching transistor connected between a second end of the anti-fuse and the output node of the second signal, and a second program transistor connected between the second end of the anti-fuse and the ground voltage. A gate of the switching transistor receives an inversion signal of the program signal and a gate of the second program transistor receives the program signal.

In some example embodiments, the first and second program units may include an anti-fuse, respectively In an example embodiment, the first program unit may include a sensing transistor which is connected between a first voltage terminal and an output node of the first signal, and a first anti-fuse for electrically connecting a gate of the sensing transistor with the first voltage terminal when the first program unit is programmed. The second program unit may include a reference resistor and a second anti-fuse which are connected between a second voltage terminal and an output node of the second signal in parallel.

In the sensing mode, a common voltage may be applied to the first and second voltage terminals.

In an example embodiment, the first program unit may include a sensing transistor connected between a first voltage terminal and an output node of the first signal, a first anti-fuse having a first end coupled to the first voltage terminal, a first switching transistor connected between a second end of the first anti-fuse and a gate of the sensing transistor, a second switching transistor which is connected between the gate of the sensing transistor and a ground voltage, a third switching transistor which is connected between the gate of the sensing transistor and the ground voltage, and a first program transistor which is connected between the second end of the first anti-fuse and the ground voltage. A gate of the first switching transistor receives a sensing enable signal, a gate of the second switching transistor receives an inversion signal of the sensing output signal, a gate of the third switching transistor receives an inversion signal of a power-up signal, and a gate of the first program transistor receives the program signal.

The second program unit may include a reference resistor which is connected between a second voltage terminal and an output node of the second signal, a second anti-fuse having a first end coupled to the second voltage terminal, a fourth switching transistor connected between a second end of the second anti-fuse and the output node of the second signal, and a second program transistor connected between the second end of the second anti-fuse and the ground voltage. A gate of the fourth switching transistor receives an inversion signal of the program signal, and a gate of the second program transistor receives the program signal.

In an example embodiment, the first program unit may include a first anti-fuse connected between a first voltage terminal and an output node of the first signal, and the second program unit may include a second anti-fuse connected between a second voltage terminal and an output node of the second signal.

In the sensing mode, a ground voltage may be applied to the first voltage terminal, and a power supply voltage is applied to the second voltage terminal.

In an example embodiment, the first program unit may include a first anti-fuse having a first end is coupled to a first voltage terminal, a first switching transistor connected between a second end of the first anti-fuse and an output node of the first signal, and a first program transistor connected between the second end of the first anti-fuse and a ground voltage. A gate of the first switching transistor receives a sensing enable signal, and a gate of the first program transistor receives the program signal.

The second program unit may include a second anti-fuse having a first end coupled to a second voltage terminal, a second switching transistor connected between a second end of the second anti-fuse and an output node of the second signal, and a second program transistor connected between the second end of the second anti-fuse and the ground voltage. A gate of the second switching transistor receives the sensing enable signal, and a gate of the second program transistor receives the program signal.

The sensing circuit may include a latch circuit or a comparator.

In an example embodiment, a semiconductor memory device includes a memory cell array, a repair circuit and an address decoder. The memory cell array includes normal memory cells and redundant memory cells. The repair circuit is programmed in a program mode to indicate the normal memory cell corresponding to the address signal is a defective cell and outputs the sensing output signal in a sensing mode. The address decoder accesses the normal memory cells or the redundant memory cells in response to an address signal and a sensing output signal.

The repair circuit includes a plurality of fuse circuits. Each fuse circuit includes a first program unit which is programmed in the program mode in response to a program signal and outputs a first signal in the sensing mode, such that the first signal increases when the first program unit is programmed, a second program unit programmed in the program mode in response to the program signal and outputs a second signal in the sensing mode, such that the second signal decreasing when the second program unit is programmed, and a sensing circuit that generates the sensing output signal in response to the first and second signals, where the sensing output signal indicates whether or not the program units are programmed.

In an example embodiment, the first program unit may include an electrical fuse connected between a first voltage terminal and an output node of the first signal, and the second program unit may include a reference resistor and an anti-fuse connected in parallel between a second voltage terminal and an output node of the second signal.

In another example embodiment, the first program unit may include a sensing transistor connected between a first voltage terminal and an output node of the first signal, and a first anti-fuse for electrically connecting a gate of the sensing transistor with the first voltage terminal when the first program unit is programmed. The second program unit may include a reference resistor and a second anti-fuse connected in parallel between a second voltage terminal and an output node of the second signal.

In still another example embodiment, the first program unit may include a first anti-fuse connected between a first voltage terminal and an output node of the first signal. The second program unit may include a second anti-fuse connected between a second voltage terminal and an output node of the second signal. In the sensing mode, a ground voltage may be applied to the first voltage terminal and a power supply voltage may be applied to the second voltage terminal.

In accordance with fuse circuits according to embodiments, the first and second program units may be programmed respectively, and the sensing circuit may compare the first signal with the second signal, which are complementarily changing by the programming operation, to determine whether or not the program units are programmed. Fuse circuits according to embodiments may determine whether or not the program units are programmed, even if one of the program units is incompletely programmed. Fuse circuits according to embodiments using only the anti-fuses are compatible with the MOS manufacturing process. The semiconductor memory device including fuse circuits according to embodiments may reliably repair the defective cells.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 2008-0010768, filed on Feb. 1, 2008, in the Korean Intellectual Property Office, and entitled: "Fuse Circuit and Semiconductor Memory Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
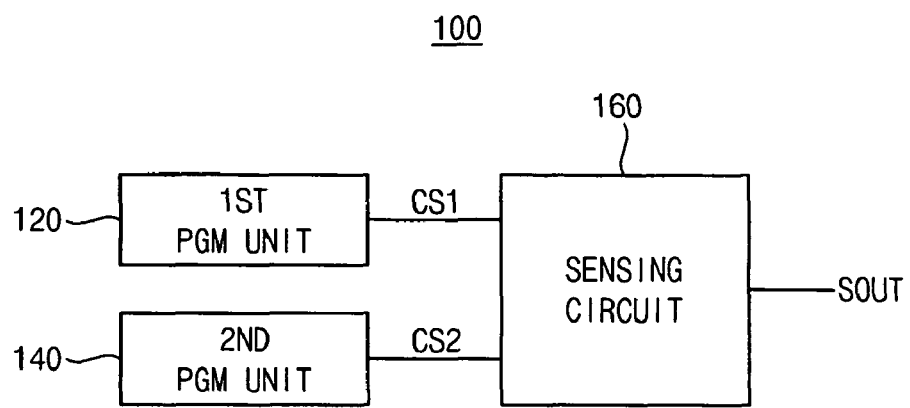
FIG. 1 illustrates a block diagram of a fuse circuit according to an example embodiment.

FIG. 1 illustrates a block diagram of a fuse circuit according to an example embodiment. Referring to FIG. 1, the fuse circuit 100 may include a first program unit 120, a second program unit 140, and a sensing circuit 160.

The first program unit 120 may be programmed in a program mode in response to a program signal and may output a first signal CS1 in a sensing mode such that the first signal CS1 increases when the first program unit is programmed. The second program unit 140 may be programmed in the program mode in response to the program signal and may output a second signal CS2 in the sensing mode such that the second signal CS2 decreases when the second program unit is programmed. The sensing circuit 160 may generate a sensing output signal SOUT in response to the first and second signals CS1 and CS2. The sensing output signal SOUT indicates whether or not the program units are programmed.

In comparison with conventional fuse circuits, the fuse circuit 100 according to an example embodiment may include first and second program units 120 and 140 that are simultaneously programmed. The first and second signals CS1 and CS2 respectively output from the first and second program units 120 and 140 may complementarily change when the program units are programmed. For example, the first signal CS1 may increase when the first program unit 120 is programmed whereas the second signal CS2 may decrease when the second program unit 140 is programmed. The first and second signals CS1 and CS2 may be current signals or voltage signals. In other words, increasing or decreasing the first and second signals CS1 and CS2 may represent that an amount of the current or voltage signals increases or decreases.

To induce such complementary change of the first and second signals CS1 and CS2 by the programming operation, a resistance of the first program unit 120 may increase when the first program unit is programmed 120 whereas a resistance of the second program unit 140 may decrease when the second program unit 140 is programmed.

For example, as discussed in detail below with reference to FIG. 2, the first program unit 120 may include an electrical fuse which is connected between a first voltage terminal and an output node of the first signal CS1, and the second program unit 140 may include a reference resistor and an anti-fuse that are connected in parallel between a second voltage terminal and an output node of the second signal CS2. In another example embodiment, increasing of the resistance of the program unit by the programming operation may be embodied by the anti-fuse instead of the electrical fuse.

Alternatively, as discussed in detail below with reference to FIG. 5, the first program unit 120 may include a sensing transistor connected between a first voltage terminal and an output node of the first signal CS1 and a first anti-fuse for electrically connecting a gate of the sensing transistor with the first voltage terminal when the first program unit 120 is programmed. The second program unit 140 may include a reference resistor and a second anti-fuse that are connected in parallel between a second voltage terminal and an output node of the second signal CS2 in parallel. When the resistance of the first program unit 120 increases and the resistance of the second program unit 140 decreases by the programming operation, a common voltage is applied to the first and second voltage terminals in the sensing mode for sensing whether or not the program units are programmed.

As a further alternative, in some embodiments, the resistances of the first and second program units 120 and 140 may increase simultaneously when program units are programmed. For example, as discussed in detail below with reference to FIG. 8, the first program unit 120 may include a first anti-fuse that is connected between a first voltage terminal and an output node of the first signal CS1, and the second program unit 140 may include a second anti-fuse that is connected between a second voltage terminal and an output node of the second signal CS2. In this case, to induce complementarily change of the first and second signals CS1 and CS2 by the programming operation, a ground voltage may be applied to the first voltage terminal whereas a power supply voltage may be applied to the second voltage terminal in the sensing mode.

Figure 2:
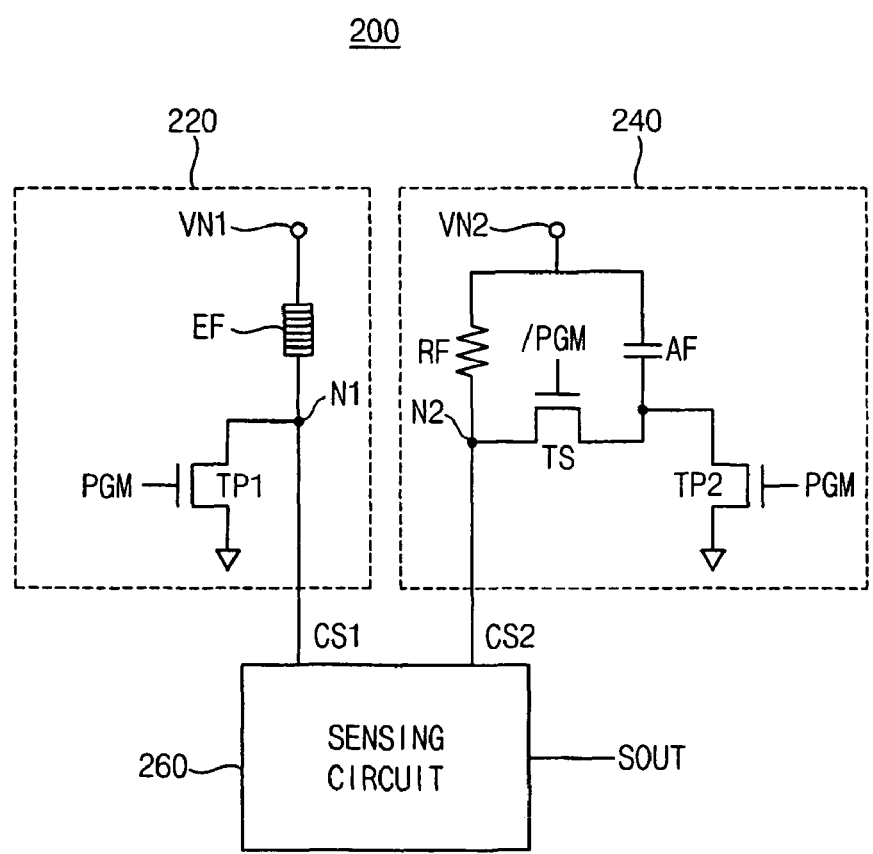
FIG. 2 illustrates a circuit diagram of an example configuration of a fuse circuit according to an example embodiment.

FIG. 2 illustrates a circuit diagram of an example configuration of a fuse circuit according to an example embodiment. Referring to FIG. 2, the fuse circuit 200 may include a first program unit 220, a second program unit 240, and a sensing circuit 260.

The first program unit 220 may include an electrical fuse EF connected between a first voltage terminal VN1 and an output node N1 of a first signal CS1. The second program unit 240 may include an anti-fuse AF and a reference resistor RF connected in parallel between a second voltage terminal VN2 and an output node N2 of a second signal CS2.

The first program unit 220 may include the electrical fuse EF and a first program transistor TP1. The electrical fuse EF may be connected between the first voltage terminal VN1 and the output node N1 of the first signal CS1. The first program transistor TP1 may be connected between the output node N1 of the first signal CS1 and a ground voltage. A gate of the first program transistor TP1 may receive a program signal PGM.

The second program unit 240 may include the reference resistor RF, the anti-fuse AF, a switching transistor TS, and a second program transistor TP2. The reference resistor RF may be connected between the second voltage terminal VN2 and the output node N2 of the second signal CS2. A first end of the anti-fuse AF may be coupled to the second voltage terminal VN2. The switching transistor TS may be connected between a second end of the anti-fuse AF and the output node N2 of the second signal CS2. A gate of the switching transistor TS may receive an inverted program signal /PGM. The second program transistor TP2 may be connected between the second end of the anti-fuse AF and the ground voltage. A gate of the second program transistor TP2 may receive the program signal PGM.

The program signal PGM may be activated when the first and second program units 220 and 240 are required to be programmed in a program mode. When the program signal PGM is activated, the first and second program transistors TP1 and TP2 may be turned on. In the program mode, a high voltage may be applied to the first voltage terminal VN1 to cause a current for cutting the electrical fuse EF and a high voltage may be applied to the second voltage terminal VN2 to electrically short the anti-fuse AF. In the program mode or the sensing mode, the first and second voltage terminal VN1 and VN2 may be electrically connected. Thus, a common voltage may be applied to the first and second voltage terminal VN1 and VN2.

Before being programmed, a resistance of the electrical fuse EF is sufficiently smaller than a resistance of the reference resistor RF. After being programmed, the electrical fuse EF is cut and the resistance of the first program unit 220 increases to infinity. After being programmed, the anti-fuse AF is electrically shorted and the switching transistor TS is turned on so that the reference resistor RF may be coupled to the shorted anti-fuse AF in parallel. Thus, a resistance of the second program unit 240 decreases to zero. The first signal CS1 is larger than the second signal CS2 before being programmed. However, after the programming operation, the first signal CS1 increases and the second signal CS2 decreases. Thus, the first signal CS1 may be smaller than the second signal CS2 after being programmed. The sensing circuit 260 may compare the first signal CS1 with the second signal CS2 complementarily changing by the programming operation and may output a sensing output signal SOUT in a sensing mode, which indicates whether or not the program units are programmed.

In an example embodiment in FIG. 2, the fuse circuit 200 has highest sensitivity when both of the electrical fuse EF and the anti fuse AF are successfully programmed. Thus, the sensitivity of the fuse circuit 200 may be improved when the reliability of the electrical fuse EF and the anti-fuse AF is guaranteed. Although the reliability of one of the electrical fuse EF and the anti fuse AF is not guaranteed, the programmed or unprogrammed state of the fuse circuit 200 may be sensed as long as only one of the program units is successfully programmed. As a result, the reliability of the fuse circuit 200 may be improved.

Figure 3:
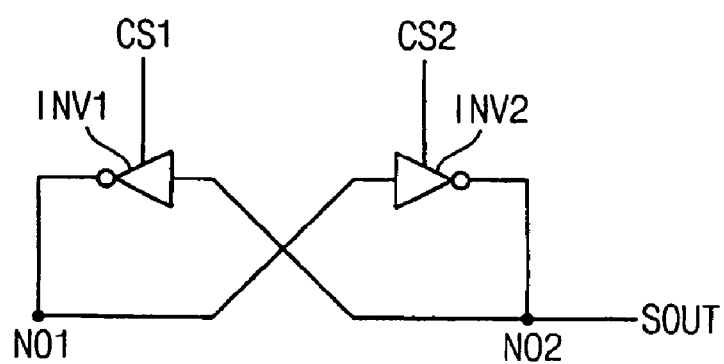
FIGS. 3 and 4 illustrate circuit diagrams of sensing circuits in a fuse circuit according to an example embodiment.
Figure 4:
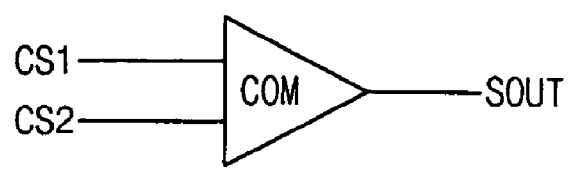

FIGS. 3 and 4 illustrate circuit diagrams of sensing circuits in a fuse circuit according to an example embodiment. A sensing circuit 260a in FIG. 3 is an example embodiment including a latch circuit. A sensing circuit 260b in FIG. 4 is an example embodiment including a comparator COM.

Referring to FIG. 3, the sensing circuit 260a may be implemented with the latch circuit including a first inverter INV1 and a second inverter INV2, where inputs and outputs of the inverters INV1 and INV2 are cross-coupled. The first inverter INV1 may operate based on the first signal CS1 generated from the first program unit 220. The second inverter INV2 may operate based on the second signal CS2 generated from the second program unit 240. The signals CS1 and CS2 may be used as a voltage source or a current source. The logic level of a first latch node NO1 may be opposite to the logic level of a second latch node NO2. Before being programmed, the first signal CS1 may be larger than the second signal CS2. Thus, a voltage of the first latch node NO1 is pulled up and a voltage of the second latch node NO2 is pulled down. After being programmed, the second signal CS2 is larger than the first signal CS1. Thus, the voltage of the first latch node NO1 is pulled down and the voltage of the second latch node NO2 is pulled up. The logic level of the sensing output signal SOUT may be logical low when the program units are not programmed and may be logical high when the program units are programmed. Thus, the sensing output signal SOUT may indicate whether or not the program units are programmed.

Figure 5:
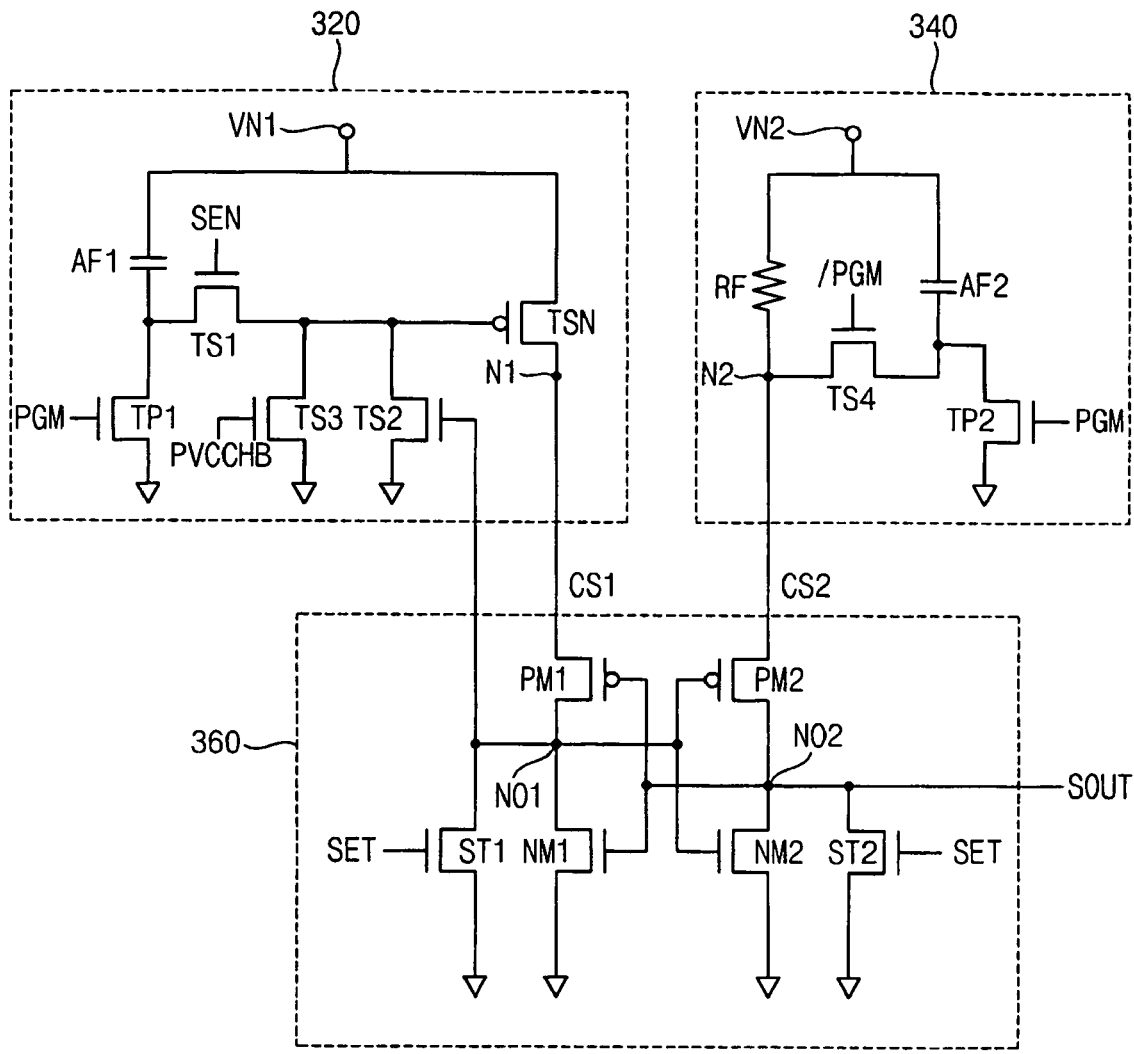
FIG. 5 illustrates a circuit diagram of an example configuration of a fuse circuit according to an example embodiment.

FIG. 3 illustrates an example embodiment using the first and second signals CS1 and CS2 as a voltage source or a current source as illustrated in an embodiment of FIG. 5. In other embodiments, the first signal CS1 may be applied to the first latch node NO1 and the second signal CS2 may be applied to the second latch node NO2, as illustrated in an embodiment of FIG. 8.

Alternatively, the sensing circuit 260b may include the comparator COM as illustrated in FIG. 4. The comparator COM may be variously configured. For example, the comparator COM may include a metal oxide semiconductor (MOS) differential pair to which the first and second signal CS1 and CS2 are applied to each gate of transistors forming the MOS differential pair.

FIG. 5 illustrates a circuit diagram of an example configuration of a fuse circuit 300 according to an example embodiment. Referring to FIG. 5, the fuse circuit 300 may include a first program unit 320, a second program unit 340, and a sensing circuit 360.

FIG. 5 illustrates an example embodiment, in which the first program unit 320 includes a sensing transistor TSN electrically connected between a first voltage terminal VN1 and an output node N1 of a first signal CS, and a first anti-fuse AF1 electrically connected between a gate of the sensing transistor TSN and the first voltage terminal VN1 when the first program unit is programmed. The second program unit 340 may include a reference resistor RF and a second anti-fuse AF2 connected in parallel between a second voltage terminal VN2 and an output node N2 of a second signal CS2.

In more detail, the first program unit 320 may include the sensing transistor TSN, the first anti-fuse AF1, a first switching transistor TS1, a second switching transistor TS2, a third switching transistor TS3, and a first program transistor TP1. The sensing transistor TSN may be connected between the first voltage terminal VN1 and the output node N1 of the first signal CS1. A first end of the first anti-fuse AF1 may be coupled to the first voltage terminal VN1. The first switching transistor TS1 may be connected between a second end of the first anti-fuse AF1 and a gate of the sensing transistor TSN. A gate of the first switching transistor TS1 may receive a sensing enable signal SEN. The second switching transistor TS2 may be connected between the gate of the sensing transistor TSN and a ground voltage. A gate of the second switching transistor TS2 may receive an inverted sensing output signal SOUT. The third switching transistor TS3 may be connected between the gate of the sensing transistor TSN and the ground voltage. A gate of the third switching transistor TS3 may receive an inverted power-up signal PVCCHB. The first program transistor TP1 may be connected between the second end of the first anti-fuse AF1 and the ground voltage. A gate of the first program transistor TP1 may receive the program signal PGM. As illustrated in FIG. 5, the gate of the second switching transistor TS2 may be coupled to a first latch node NO1 that is an inversion node of a second latch node NO2 outputting the sensing output signal SOUT.

The second program unit 340 may include the reference resistor RF, the second anti-fuse AF2, a fourth switching transistor TS4, and a second program transistor TP2. The reference resistor RF may be connected between the second voltage terminal VN2 and the output node of the second signal CS2. A first end of the second anti-fuse AF2 may be coupled to the second voltage terminal VN2. The fourth switching transistor TS4 may be connected between a second end of the second anti-fuse AF2 and the output node of the second signal CS2. A gate of the fourth switching transistor TS4 may receive an inverted program signal /PGM. The second program transistor TP2 may be connected between the second end of the second anti-fuse AF2 and the ground voltage. A gate of the second program transistor TP2 may receive the program signal PGM.

In comparison with the first program unit 220 in FIG. 2, the first program unit 320 in FIG. 5 includes the first anti-fuse AF1 instead of the electrical fuse EF. The first program unit 320 may operate similarly to the first program unit 220 in FIG. 2. In this embodiment, the program units 320 and 340 include only anti-fuses AF1 and AF2. Thus, the fuse circuit 300 in FIG. 5 has an advantage of a smaller fuse circuit.

The sensing circuit 360 may include a first p-type metal oxide semiconductor transistor (PMOS) PM1, a second PMOS transistor PM2, a first n-type metal oxide semiconductor transistor (NMOS) NM1, a second NMOS transistor NM2, a first setting transistor ST1, and a second setting transistor ST2. The first PMOS transistor PM1 and the first NMOS transistor NM1 form one inverter, and the second PMOS transistor PM2 and the second NMOS transistor NM2 form another inverter. Inputs and outputs of the inverters may be cross-coupled to form a latch. The first setting transistor may initialize a voltage of the first latch node NO1 in response to the setting signal SET. The second setting transistor ST2 may initialize a voltage of the second latch node NO2 in response to the setting signal SET. Operations of the fuse circuit 300 in FIG. 5 will be described later with reference to FIG. 7.

Figure 6:
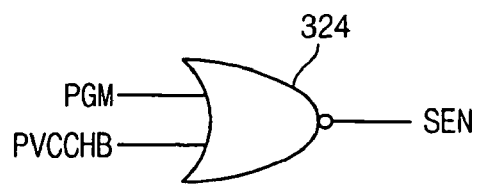
FIG. 6 illustrates a circuit diagram of a circuit of generating a sensing enable signal that is applied to the fuse circuit of FIG. 5.

FIG. 6 illustrates a circuit diagram of a circuit of generating a sensing enable signal that is applied to the fuse circuit of FIG. 5. Referring to FIG. 6, the sensing enable signal SEN may be generated based on the program signal PGM and the power-up signal PVCCH using a NOR logic gate 324.

In detail, the NOR logic gate 324 may output the sensing enable signal by performing a NOR operation on the program signal PGM and the inverted power-up signal PVCCHB. Generally, the power-up signal PVCCH is generated to prevent indefinite logic level of latch nodes in internal circuits, e.g., the fuse circuits, when the internal circuits are powered up. The power-up signal PVCCH may transition to logic high level when the source voltage approaches a predetermined level for definitely defining the logical levels of latch nodes. The program signal PGM may be activated (e.g., logic high level) in a program mode when the program units need to be programmed and may be deactivated (e.g., logic low level) in a sensing mode. The inverted power-up signal PVCCHB may maintain a logic low level after the power supply voltage is stabilized, thus activating the sensing enable signal SEN (e.g., logic high level) in the sensing mode. The sensing enable signal SEN is related to control a turn-on timing of the first switching transistor TS1 in FIG. 5.

Figure 7:
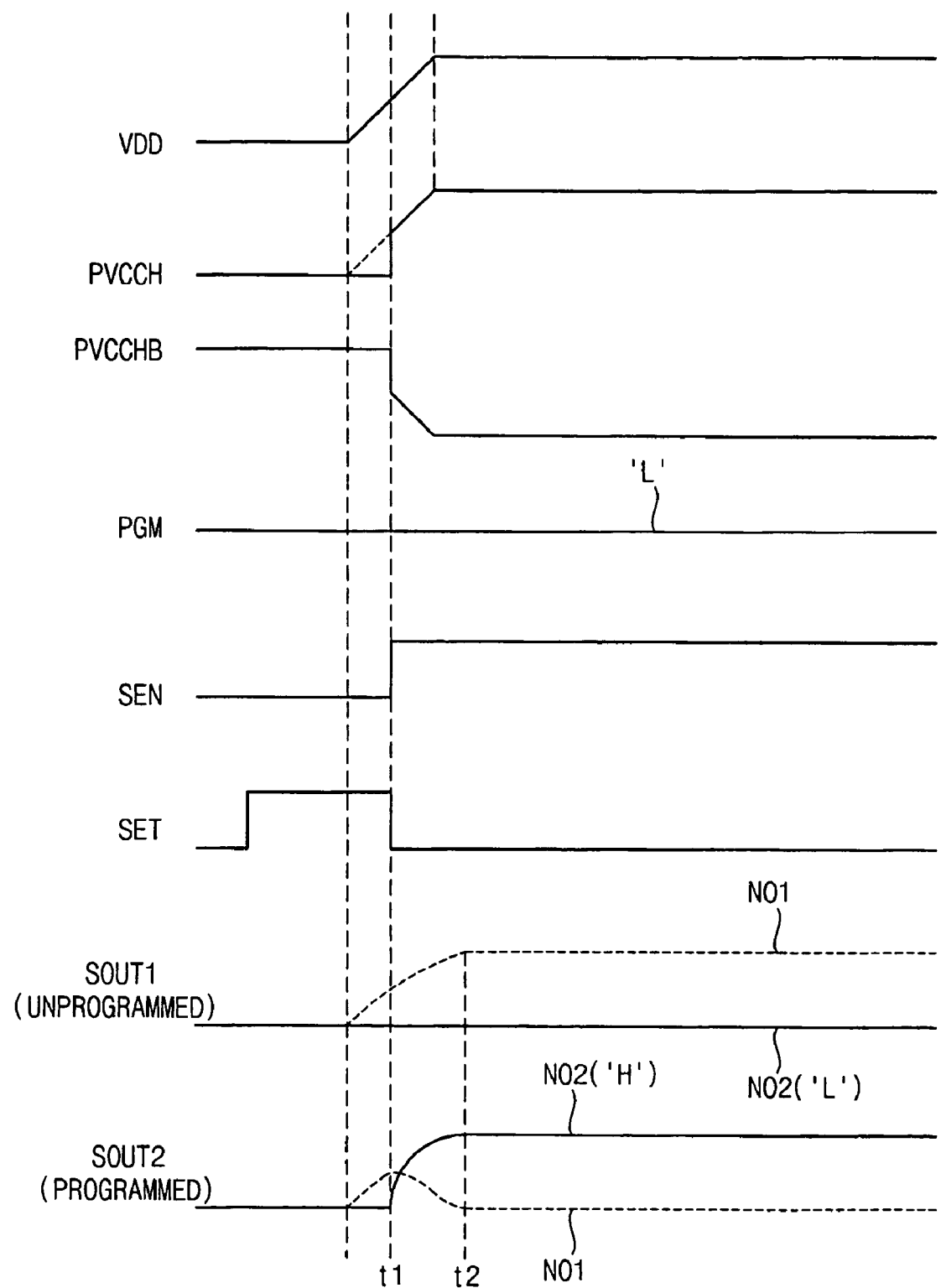
FIG. 7 illustrates a timing diagram of operations of the fuse circuit of FIG. 5.

Hereinafter, operation of the fuse circuit according to an example embodiment is described with reference to FIGS. 5, 6, and 7. FIG. 7 illustrates a timing diagram of operation of the fuse circuit of FIG. 5. FIG. 7 illustrates a sensing output signal SOUT1 corresponding to an unprogrammed state of the program units 23- and a sensing output signal SOUT2 corresponding to a programmed state of the program units.

In the sensing mode, the program signal PGM maintains deactivated logic low level 'L' and the fourth switching transistor TS4 is turned on. Before the sensing mode, the setting signal SET is activated to initialize voltages of the first and second latch node NO1 and NO2 to the same level. When the fuse circuit 300 is powered up, the power supply voltage VDD begins to increase. The power-up signal PVCCH transitions to logic high level and the inverted power-up signal PVCCHB transitions to logic low level when the power supply voltage VDD approaches a predetermined level. The sensing enable signal SEN is activated at a time t1 in response to the program signal PGM and the power-up signal PVCCH. Thus, the first switching transistor TS1 is turned on.

As the third switching transistor TS3 is turned on from power-up starting time to the time t1, the ground voltage is applied to the gate of the sensing transistor TSN. Thus, the sensing transistor TSN is turned on. Since a turn-on resistance of the sensing transistor TSN is sufficiently smaller than a resistance of the reference resistor RF, the first latch node NO1 transitions to logic high level and the second latch node NO2 transitions to logic low level at the time t1.

When the anti-fuses AF1 and AF2 are unprogrammed, the first latch node NO1 is logic high level at the time t1 and the second switching transistor TS2 is turned on. Although the first switching transistor TS1 is turned on, the gate of the sensing transistor TSN is electrically disconnected from the first voltage terminal VN1 due to the first anti-fuse AF1. Thus, the sensing transistor TSN is still turned on. At a time t2, the voltage of the first and second latch node NO1 and NO2 is stable, and the sensing output signal SOUT1 maintains logic low level 'L'.

When the anti-fuse AF1 is programmed, the first switching transistor TS1 is turned on at the time t1, and the first voltage terminal VN1 is electrically coupled to the gate of the sensing transistor TSN and a gate voltage of the sensing transistor TSN is pulled up. Thus, the sensing transistor TSN is turned off and the first signal CS1 begins to decrease. When the second anti-fuse AF2 is programmed, simultaneously with the programming of the anti-fuse AF1, a resistance of the second program unit 320 decreases, increasing the second signal CS2. Thus, the first latch node NO1 transitions to logic low level and the second latch node NO2 transitions to logic high level. The second switching transistor TS2 is turned off as the first latch node NO1 transitions to logic low level. At the time t2, the voltage of the first and second latch node NO1 and NO2 is stable, and the sensing output signal SOUT2 maintains in logic high level.

As such, the sensing circuit 360 outputs the sensing output signal SOUT1 having logic low level when the program units are unprogrammed and outputs the sensing output signal SOUT2 having logic high level when the program units are programmed. Based on the logic level of the sensing output signal, the sensing circuit 360 determines whether or not the program units are programmed.

Figure 8:
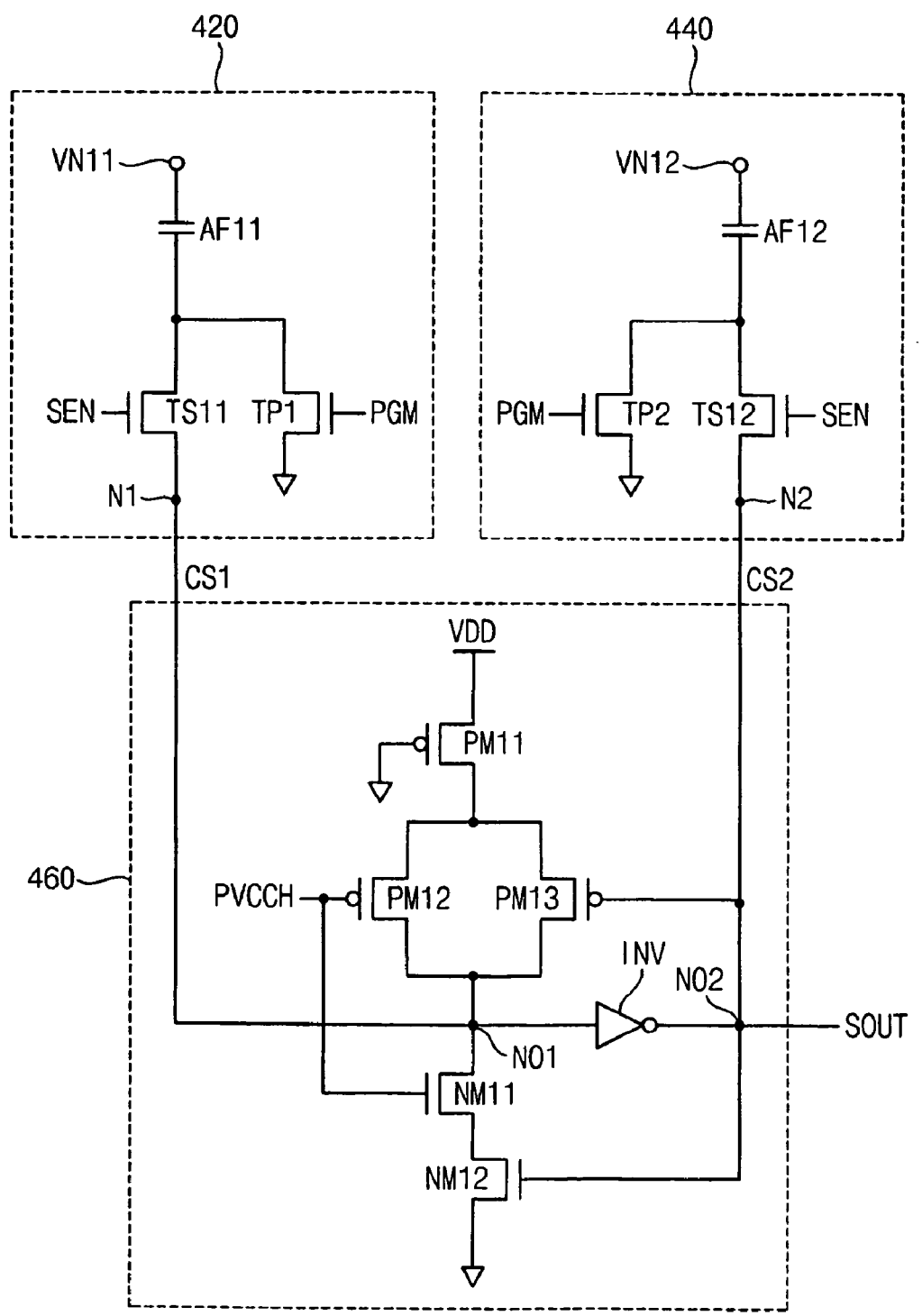
FIG. 8 illustrates a circuit diagram of an example configuration of a fuse circuit according to an example embodiment.

FIG. 8 illustrates a circuit diagram of an example configuration of a fuse circuit 400 according to an example embodiment. Referring to FIG. 8, the fuse circuit 400 may include a first program unit 420, a second program unit 440, and a sensing circuit 460.

The first program unit 420 may include a first anti-fuse AF11 connected between a first voltage terminal VN11 and an output node N1 of a first signal CS1. The second program unit 440 may include a second anti-fuse AF12 connected between a second voltage terminal VN12 and an output node N2 of the second signal CS2.

In more detail, the first program unit 420 may include the first anti-fuse AF11, a first switching transistor TS11, and a first program transistor TP1. A first end of the first anti-fuse AF11 may be coupled to the first voltage terminal VN11. The first switching transistor TS11 may be connected between a second end of the first anti-fuse AF11 and an output node N1 of the first signal CS1. A gate of the first switching transistor TS11 may receive a sensing enable signal SEN. The first program transistor TP1 may be connected between the second end of the first anti-fuse AF11 and a ground voltage. A gate of the first program transistor TP1 may receive the program signal PGM.

The second program unit 440 may include the second anti-fuse AF12, a second switching transistor TS12, and a second program transistor TP2. A first end of the second anti-fuse AF12 may be coupled to the second voltage terminal VN12. The second switching transistor TS12 may be connected between a second end of the second anti-fuse AF12 and an output node N2 of the second signal CS2. A gate of the second switching transistor TS12 may receive the sensing enable signal SEN. The second program transistor TP2 may be connected between the second end of the second anti-fuse AF12 and a ground voltage. A gate of the second program transistor TP2 may receive the program signal PGM.

The sensing circuit 460 may include a first PMOS transistor PM11, a second PMOS transistor PM12, a third PMOS transistor PM13, a first NMOS transistor NM11, a second NMOS transistor NM12, and an inverter INV. The third PMOS transistor PM13 and the second NMOS transistor NM12 may operate as an inverter. Thus the sensing circuit 460 has a latch configuration where two inverters are cross-coupled. The second PMOS transistor PM12 and the first NMOS transistor NM11 are provided for setting an initial condition of the latch nodes NO1 and NO2.

A voltage for pulling down a voltage of the first latch node NO1 may be applied to the first voltage terminal VN11 and a voltage for pulling up a voltage of the second latch node NO2 may be applied to the second voltage terminal VN12 in the sensing mode. For example, the ground voltage may be applied to the first voltage terminal VN11 and the power supply voltage may be applied to the second voltage terminal VN12 in the sensing mode.

The second PMOS transistor PM12 is turned on and the first NMOS transistor NM11 is turned off before the power-up signal PVCCH is activated in logic high level. Thus, the first latch node NO1 is set to logic high level and the second latch node NO2 is set to logic low level.

When the anti-fuses AF11 and AF12 are unprogrammed, although the switching transistors TS11 and TS12 are turned on by activating the sensing enable signal SEN, electrical connection between the voltage terminals VN11 and VN12 and the latch nodes NO1 and NO2 is cut off. Thus, the second latch node NO2 is stable in logic low level and the sensing output signal SOUT maintains logic low level.

When the anti-fuses AF11 and AF12 are programmed, the switching transistors TS11 and TS12 are turned on by activating the sensing enable signal SEN. Thus, the voltage terminals VN11 and VN12 and the latch nodes NO1 and NO2 are electrically connected. A relatively low pulling-down voltage may be applied to the first voltage terminal VN11 and a relatively high pulling-up voltage may be applied to the second voltage terminal VN12. Thus, the voltage of the first latch node NO1 changes to logic low level and the voltage of the second latch node NO2 changes to logic high level. Thus, the second latch node NO2 is stable in logic high level and the sensing output signal SOUT maintains logic high level.

As such, the sensing output signal SOUT of the sensing circuit 460 is output in logic low level when the program units are unprogrammed and is output in logic high level when the program units are programmed. Thus, the sensing output signal SOUT indicates whether or not the program units are programmed.

Figure 9:
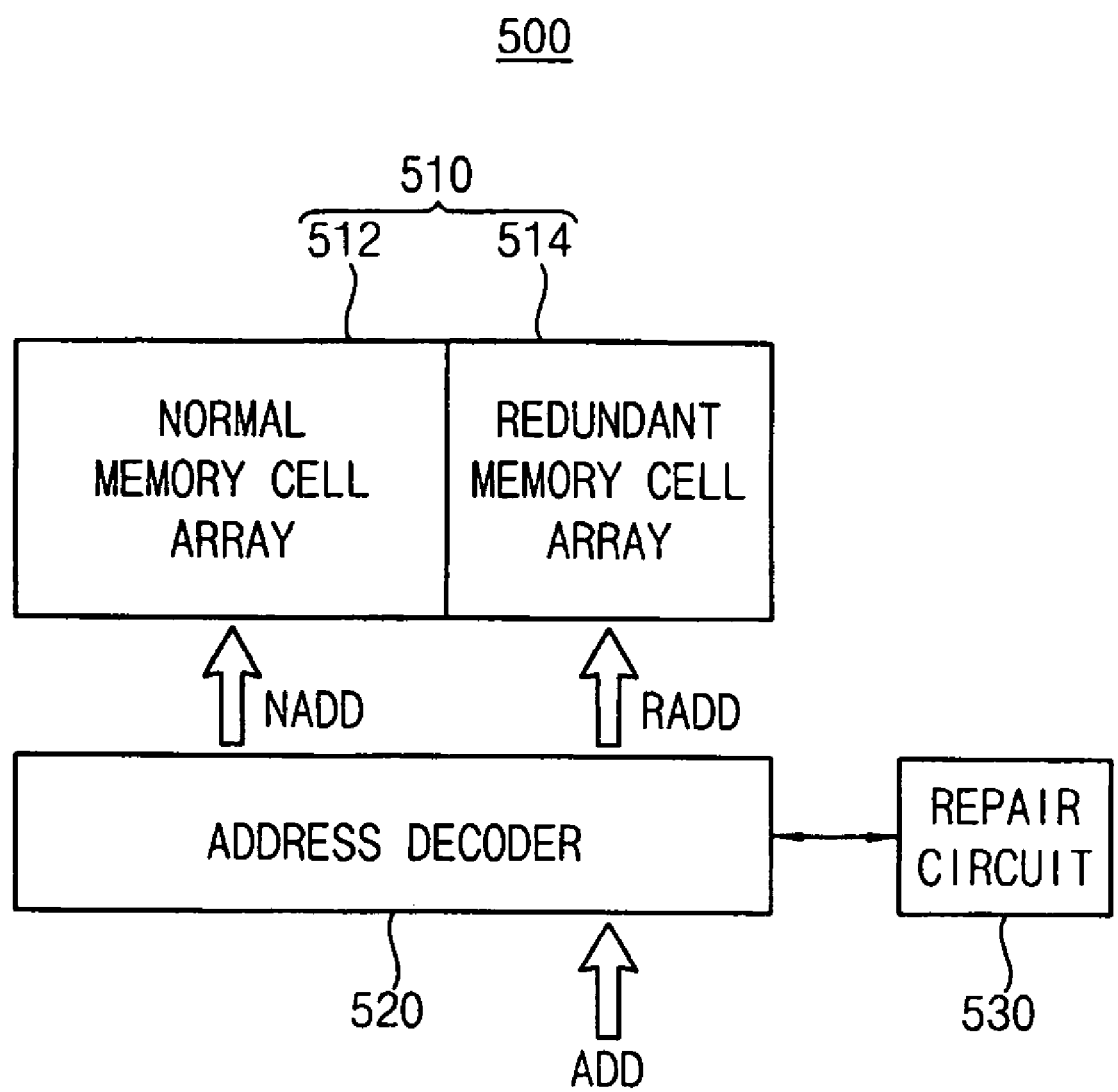
FIG. 9 illustrates a block diagram of a semiconductor memory device according to an example embodiment.

FIG. 9 illustrates a block diagram of a semiconductor memory device 500 according to an example embodiment. Referring to FIG. 9, the semiconductor memory device 500 may include a memory cell array 510, an address decoder 520, and a repair circuit 530.

The memory cell array 510 may include a normal memory cell array 512 including normal memory cells and a redundant memory cell array 514 including redundant memory cells. The redundant memory cell array 514 may include a plurality of memory blocks scattered in memory cell array 510. Fuse circuits in the repair circuit 530 may be programmed when normal memory cells have defects, i.e., when the repair circuit 530 outputs a sensing output signal indicating whether or not the program units are programmed. The address decoder 520 may selectively output a normal address signal NADD or a redundant address signal RADD in response to an address signal ADD and the sensing output signal to thereby access the normal memory cells or the redundant memory cells, respectively. The address decoder 520 may be a row decoder to select a word line, may be a column decoder to select a bit line, or may include both row and column decoders. The repair circuit 530 may repair the defective memory cell in a row unit or in a column unit.

The repair circuit 530 may include a plurality of fuse circuits. As described with reference to FIGS. 1 through 8, each fuse circuit may include a first program unit, a second program unit, and a sensing circuit. The first program unit may be programmed in a program mode in response to a program signal and may output a first signal in a sensing mode such that the first signal increases when the first program unit is programmed. The second program unit may be programmed in the program mode in response to the program signal and may output a second signal in a sensing mode such that the second signal decreases when the second program unit is programmed. The sensing circuit may generate a sensing output signal in response to the first and second signals, the sensing output signal indicating whether or not the program units are programmed.

If even a single memory cell within a semiconductor memory device functions improperly, the semiconductor memory device may be considered to be defective. However, if a relatively small number of memory cells are malfunctioning, it may not be efficient to treat the entire semiconductor memory device as being defective. Therefore, one or more redundancy memory cells may be included within the semiconductor memory device so that the redundancy memory cells may functionally replace defective memory cells within the semiconductor memory device. Accordingly, the semiconductor memory device, by replacing the defective memory cell with the redundancy memory cells, may be treated as a non-defective or normal semiconductor memory device, thereby increasing a yield of semiconductor memory devices. A repairing process using the redundancy memory cells may include replacing the defective memory cell with the redundancy memory cell by switching corresponding addresses. For example, if the defective memory cell is detected by a test after wafer processing, a corresponding address of the defective memory cell may be switched to an address of the redundancy memory cell. Therefore, an address of the defective memory cell may be mapped to an address of the redundancy memory cell instead. Fuse circuits may be used to perform the above-mentioned repairing process. If the reliability of fuse circuits used is low, possibility of malfunction of the semiconductor memory device is high. Therefore, performance of the semiconductor memory device may be enhanced by using fuse circuits having improved reliability.

In accordance with the above described embodiments, signals that are complementarily changed by the programming operation are compared to determine whether or not the program units are programmed. Thus, reliability of fuse circuits may be improved. The above described embodiments may be applied to arbitrary devices requiring the fuse circuit, such as the semiconductor memory device.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A fuse circuit comprising:
 a first program unit configured to be programmed in a program mode in response to a program signal and configured to output a first signal in a sensing mode, the first signal increasing when the first program unit is programmed;
 a second program unit configured to be programmed in the program mode in response to the program signal and configured to output a second signal in the sensing mode, the second signal decreasing when the second program unit is programmed; and
 a sensing circuit configured to generate a sensing output signal in response to the first and second signals, the sensing output signal indicating whether or not the first and second program units are programmed.

2. The fuse circuit as claimed in claim 1, wherein:
 a resistance of the first program unit increases when the first program unit is programmed; and
 a resistance of the second program unit decreases when the second program unit is programmed.

3. The fuse circuit as claimed in claim 1, wherein:
the first program unit includes an electrical fuse connected between a first voltage terminal and an output node of the first signal; and
the second program unit includes a reference resistor and an anti-fuse connected in parallel between a second voltage terminal and an output node of the second signal.

4. The fuse circuit as claimed in claim 3, wherein a common voltage is applied to the first and second voltage terminals in the sensing mode.

5. The fuse circuit as claimed in claim 1, wherein the first program unit includes:
an electrical fuse connected between a first voltage terminal and an output node of the first signal; and
a first program transistor connected between the output node of the first signal and a ground voltage, a gate of the first program transistor receiving the program signal.

6. The fuse circuit as claimed in claim 5, wherein the second program unit includes:
a reference resistor connected between a second voltage terminal and an output node of the second signal;
an anti-fuse, a first end of the anti-fuse being coupled to the second voltage terminal;
a switching transistor connected between a second end of the anti-fuse and the output node of the second signal, a gate of the switching transistor receiving an inverted program signal; and
a second program transistor connected between the second end of the anti-fuse and the ground voltage, a gate of the second program transistor receiving the program signal.

7. The fuse circuit as claimed in claim 1, wherein the first and second program units each include an anti-fuse.

8. The fuse circuit as claimed in claim 7, wherein:
the first program unit includes a sensing transistor connected between a first voltage terminal and an output node of the first signal, and a first anti-fuse for electrically connecting a gate of the sensing transistor with the first voltage terminal when the first program unit is programmed; and
the second program unit includes a reference resistor and a second anti-fuse connected in parallel between a second voltage terminal and an output node of the second signal.

9. The fuse circuit as claimed in claim 8, wherein a common voltage is applied to the first and second voltage terminals in the sensing mode.

10. The fuse circuit as claimed in claim 7, wherein the first program unit includes:
a sensing transistor connected between a first voltage terminal and an output node of the first signal;
a first anti-fuse, a first end of the first anti-fuse being coupled to the first voltage terminal;
a first switching transistor connected between a second end of the first anti-fuse and a gate of the sensing transistor, a gate of the first switching transistor receiving a sensing enable signal;
a second switching transistor connected between the gate of the sensing transistor and a ground voltage, a gate of the second switching transistor receiving an inversion signal of the sensing output signal;
a third switching transistor connected between the gate of the sensing transistor and the ground voltage, a gate of the third switching transistor receiving an inversion signal of a power-up signal; and
a first program transistor connected between the second end of the first anti-fuse and the ground voltage, a gate of the first program transistor receiving the program signal.

11. The fuse circuit as claimed in claim 10, wherein the second program unit includes:
a reference resistor connected between a second voltage terminal and an output node of the second signal;
a second anti-fuse, a first end of the second anti-fuse being coupled to the second voltage terminal;
a fourth switching transistor connected between a second end of the second anti-fuse and the output node of the second signal, a gate of the fourth switching transistor receiving an inverted program signal; and
a second program transistor connected between the second end of the second anti-fuse and the ground voltage, a gate of the second program transistor receiving the program signal.

12. The fuse circuit as claimed in claim 7, wherein:
the first program unit includes a first anti-fuse connected between a first voltage terminal and an output node of the first signal; and
the second program unit includes a second anti-fuse connected between a second voltage terminal and an output node of the second signal.

13. The fuse circuit as claimed in claim 12, wherein a ground voltage is applied to the first voltage terminal and a power supply voltage is applied to the second voltage terminal in the sensing mode.

14. The fuse circuit as claimed in claim 1, wherein the first program unit includes:
a first anti-fuse, a first end of the first anti-fuse being coupled to a first voltage terminal;
a first switching transistor connected between a second end of the first anti-fuse and an output node of the first signal, a gate of the first switching transistor receiving a sensing enable signal; and
a first program transistor connected between the second end of the first anti-fuse and a ground voltage, a gate of the first program transistor receiving the program signal.

15. The fuse circuit as claimed in claim 14, wherein the second program unit includes:
a second anti-fuse, a first end of the second anti-fuse being coupled to a second voltage terminal;
a second switching transistor connected between a second end of the second anti-fuse and an output node of the second signal, a gate of the second switching transistor receiving the sensing enable signal; and
a second program transistor connected between the second end of the second anti-fuse and the ground voltage, a gate of the second program transistor receiving the program signal.

16. The fuse circuit as claimed in claim 1, wherein the sensing circuit includes a latch circuit or a comparator.

17. A semiconductor memory device, comprising:
a memory cell array including normal memory cells and redundant memory cells;
an address decoder configured to access the normal memory cells or the redundant memory cells in response to an address signal and a sensing output signal; and
a repair circuit configured to be programmed in a program mode to indicate the normal memory cell corresponding to the address signal is a defective cell and configured to output the sensing output signal in a sensing mode, the repair circuit including a plurality of fuse circuits, each fuse circuit including:
a first program unit configured to be programmed in the program mode in response to a program signal and configured to output a first signal in the sensing mode, the first signal increasing when the first program unit is programmed;

a second program unit configured to be programmed in the program mode in response to the program signal and configured to output a second signal in the sensing mode, the second signal decreasing when the second program unit is programmed; and a sensing circuit configured to generate the sensing output signal in response to the first and second signals, the sensing output signal indicating whether or not the first and second program units are programmed.

18. The semiconductor memory device as claimed in claim 17, wherein:

the first program unit includes an electrical fuse connected between a first voltage terminal and an output node of the first signal; and the second program unit includes a reference resistor and an anti-fuse connected in parallel between a second voltage terminal and an output node of the second signal.

19. The semiconductor memory device as claimed in claim 17, wherein:

the first program unit includes a sensing transistor connected between a first voltage terminal and an output node of the first signal, and a first anti-fuse for electrically connecting a gate of the sensing transistor with the first voltage terminal when the first program unit is programmed; and the second program unit includes a reference resistor and a second anti-fuse connected in parallel between a second voltage terminal and an output node of the second signal.

20. The semiconductor memory device as claimed in claim 17, wherein:

the first program unit includes a first anti-fuse connected between a first voltage terminal and an output node of the first signal;

the second program unit includes a second anti-fuse connected between a second voltage terminal and an output node of the second signal; and in the sensing mode, a ground voltage is applied to the first voltage terminal and a power supply voltage is applied to the second voltage terminal.

* * * * *